(12) United States Patent
Joshi et al.

(10) Patent No.: US 12,720,845 B2
(45) Date of Patent: Aug. 25, 2026

(54) SEMICONDUCTOR DEVICE WITH METAL NITRIDE LAYER AND A METHOD OF MANUFACTURING THEREOF

(71) Applicant: Infineon Technologies AG, Neubiberg (DE)

(72) Inventors: Ravi Keshav Joshi, Klagenfurt am Wörthersee (AT); Romain Esteve, Munich (DE); Saurabh Roy, Villach (AT); Bernhard Goller, Villach (AT); Werner Schustereder, Villach (AT); Kristijan Luka Mletschnig, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 594 days.

(21) Appl. No.: 18/097,656

(22) Filed: Jan. 17, 2023

(65) Prior Publication Data

US 2023/0238442 A1 Jul. 27, 2023

(30) Foreign Application Priority Data

Jan. 21, 2022 (DE) ......................... 102022101404.5
May 31, 2022 (DE) ......................... 102022113729.5

(51) Int. Cl.
*H10D 64/62* (2025.01)
*H10D 64/01* (2025.01)
(Continued)

(52) U.S. Cl.
CPC ............ *H10D 64/62* (2025.01); *H10D 64/01* (2025.01); *H10D 64/252* (2025.01); *H10P 95/00* (2026.01); *H10W 20/43* (2026.01)

(58) Field of Classification Search
CPC ............... H01L 21/321; H01L 21/0485; H01L 21/28512; H01L 23/528; H10D 30/66;
(Continued)

(56) References Cited

U.S. PATENT DOCUMENTS 6,028,003 A 2/2000 Frisa et al.
2004/0029377 A1 2/2004 Lee et al.
(Continued)

FOREIGN PATENT DOCUMENTS

CN 112768510 A 5/2021
JP H09283738 A 10/1997
(Continued)

OTHER PUBLICATIONS

JP-3439597-B2, machine translation (Year: 2003).*
Zhongtao Wang, et al.; "Ohmic contact formation mechanisms of TiN film on 4H-SiC"; Nov. 22, 2019; 8 Pgs.

*Primary Examiner* — Andres Munoz
(74) *Attorney, Agent, or Firm* — Cooper Legal Group LLC

(57) ABSTRACT

A semiconductor device includes a semiconductor substrate and a metal nitride layer above the semiconductor substrate. The metal nitride layer forms at least one interface region with the semiconductor substrate. The at least one interface region includes a first portion of the semiconductor substrate, a first portion of the metal nitride layer, and an interface between the first portion of the semiconductor substrate and the first portion of the metal nitride layer. A concentration of nitrogen content at the first portion of the metal nitride layer is higher than a concentration of nitrogen content at a second portion, of the metal nitride layer, outside the interface region. A distribution of nitrogen content throughout the metal nitride layer may have a maximum concentration at the first portion of the metal nitride layer.
(Continued)

Alternatively and/or additionally, a method for producing such a semiconductor device is provided herein.

11 Claims, 1 Drawing Sheet

(51) Int. Cl.
*H10D 64/23* (2025.01)
*H10P 95/00* (2026.01)
*H10W 20/43* (2026.01)

(58) Field of Classification Search
CPC ........... H10D 62/8325; H10D 62/8503; H10D 64/252; H10D 64/62; H10D 64/01; H10D 64/0111; H10D 64/0115; H10P 95/00; H10W 20/43
See application file for complete search history.

(56) References Cited

U.S. PATENT DOCUMENTS

| | | | |
|---|---|---|---|
| 2004/0164380 | A1 | 8/2004 | Nagasawa |
| 2013/0306978 | A1 | 11/2013 | Chen et al. |
| 2016/0181388 | A1 | 6/2016 | Konrath et al. |
| 2018/0301338 | A1 | 10/2018 | Hilsenbeck |
| 2019/0164822 | A1 | 5/2019 | Chou et al. |
| 2019/0362973 | A1 | 11/2019 | Krivec et al. |

FOREIGN PATENT DOCUMENTS

| | | | | |
|---|---|---|---|---|
| JP | 3439597 | B2 | * | 8/2003 |
| JP | 200641248 | A | | 8/2021 |
| WO | 2018040562 | A1 | | 3/2018 |

* cited by examiner

SEMICONDUCTOR DEVICE WITH METAL NITRIDE LAYER AND A METHOD OF MANUFACTURING THEREOF

RELATED APPLICATIONS

This application claims priority to German Patent Application No. 102022101404.5, filed on Jan. 21, 2022, entitled "SEMICONDUCTOR DEVICE WITH METAL NITRIDE LAYER AND A METHOD OF MANUFACTURING THEREOF", and German Patent Application No. 102022113729.5, filed on May 31, 2022, entitled "SEMICONDUCTOR DEVICE WITH METAL NITRIDE LAYER AND A METHOD OF MANUFACTURING THEREOF", both of which are incorporated by reference herein in their entirety.

TECHNICAL FIELD

The present disclosure generally relates to semiconductor devices comprising a metal nitride layer as a metallization structure for Ohmic contacts to a semiconductor substrate, especially as metallization structure for backside Ohmic contacts. Further embodiments pertain to methods of producing semiconductor devices comprising a metal nitride layer for Ohmic contact formation.

BACKGROUND

Semiconductor devices include metal or metallization structures to contact the active regions of the semiconductor substrate. For example, Al-based metal structures or layers may be formed in contact with active regions at the frontside of the semiconductor substrate. Bond wires attached to the Al-based metal structures provide the connection to lead-outs of the package into which the semiconductor device is integrated or embedded. Examples of packages are discrete TO-packages to accommodate a single semiconductor device or power modules housing two or more separate semiconductor devices.

Vertical semiconductor devices need an additional electrical contact at the backside of the semiconductor device which is provided by a so-called backside metallization. In addition to providing a low-Ohmic contact resistance to the semiconductor substrate, the backside metallization also provides a mechanical connection between the semiconductor substrate and a housing or carrier substrate. The backside metallization may be soldered to a lead frame. The metallization structures and the solder connections need to be reliable throughout the live time of the semiconductor device and should withstand mechanical stress caused by thermal cycling occurring during operation of the semiconductor device.

For providing a good and reliable Ohmic connection, a metal layer capable of forming a metal silicide interface with the semiconductor substrate may be formed in direct contact with the semiconductor substrate. In case of backside Ohmic contacts, for example for contacting the drain side of silicon carbide (SiC) metal-oxide-semiconductor field effect transistors (MOSFETs), they can be realized by using nickel silicide (NiSi) metal and laser thermal annealing (LTA) process.

In the current processes applied for the manufacturing of those contacts, the process window for laser energy during LTA is rather small due to both, tool limitations as well as weakness in integration scheme. Several issues occur such as NiSi bumps, impact of surface roughness coming from grinding, generation of silicon dioxide particles within the metal layer or at the interface of SiC/metal or from carbon grains or a carbon layer on the metal, within the silicide layer, or at the interface of SiC/metal. At least some of these issues cause mechanical instability of backside metallization due to, e. g. delamination or die cracks within the metal layer or the stack of layers above the SiC substrate. Therefore, this situation may cause yield loss during the manufacturing process or at least the reliability of the obtained semiconductor devices fails.

Attempts have been made to reduce formation of carbon clusters by appropriately selecting the material composition of the metal layer and the process conditions of the thermal anneal. However, there is a demand to provide alternative manufacturing processes for semiconductor devices which offer broader process windows for LTA and reduce or remove the formation of biproducts like formation of carbon clusters or graphitic layers. Furthermore, there is a need of providing semiconductor devices having reliable contacts in a simple and cost sensitive manner.

SUMMARY

According to an embodiment, a semiconductor device comprises a semiconductor substrate and a metal nitride layer above the semiconductor substrate. The metal nitride layer forms at least one interface region with the semiconductor substrate. The at least one interface region comprises a first portion of the semiconductor substrate, a first portion of the metal nitride layer, and/or an interface between the first portion of the semiconductor substrate and the first portion of the metal nitride layer (e.g., the first portion of the semiconductor substrate and the first portion of the metal nitride layer may be in direct contact at the interface). A concentration of nitrogen content at the first portion of the metal nitride layer may be higher than a concentration of nitrogen content at a second portion, of the metal nitride layer, outside the interface region. In an example, the concentration of nitrogen content at the first portion of the metal nitride layer may be higher than concentrations of nitrogen content throughout all portions, of the metal nitride layer, outside the interface region. A distribution of nitrogen content throughout the metal nitride layer may have a maximum concentration at the first portion of the metal nitride layer. Accordingly, semiconductor devices with good electrical performance can be obtained.

According to an embodiment, a method for producing a semiconductor device with a metal nitride layer above a semiconductor substrate is described. The method may comprise providing a semiconductor substrate and depositing a metal nitride layer above the semiconductor substrate, thereby forming at least one interface region with the semiconductor substrate. The at least one interface region comprises a first portion of the semiconductor substrate, a first portion of the metal nitride layer, and/or an interface between the first portion of the semiconductor substrate and the first portion of the metal nitride layer (e.g., the first portion of the semiconductor substrate and the first portion of the metal nitride layer may be in direct contact at the interface). The method may comprise performing thermal annealing of at least the metal nitride layer. The thermal annealing is performed such that nitrogen atoms and/or nitrogen molecules from the metal nitride layer are enriched in the at least one interface region. A concentration of nitrogen content at the first portion of the metal nitride layer may be higher than a concentration of nitrogen content at a second portion, of the metal nitride layer, outside the interface region. The concentration of nitrogen content at the first portion of the metal nitride layer being higher than the concentration of nitrogen content at the second portion of the metal nitride layer may be due, at least in part, to the thermal annealing. In an example, the concentration of nitrogen content at the first portion of the metal nitride layer may be higher than concentrations of nitrogen content throughout all portions, of the metal nitride layer, outside the interface region. The concentration of nitrogen content at the first portion of the metal nitride layer being higher than the concentrations of nitrogen content throughout all portions of the metal nitride layer outside of the interface region may be due, at least in part, to the thermal annealing. A distribution of nitrogen content throughout the metal nitride layer may have a maximum concentration at the first portion of the metal nitride layer. The maximum concentration of the distribution of nitrogen content being at the first portion of the metal nitride layer (as opposed to being at a portion of the metal nitride layer outside of the interface region, for example) may be due, at least in part, to the thermal annealing. "Maximum concentration" in the sense of this application means a local increase in concentration of nitrogen content within the metal nitride layer, which is higher than the average concentration of nitrogen content in the metal nitride layer. In some embodiments, the highest local nitrogen concentration within the metal nitride layer can be measured at the interface region (e.g., the maximum concentration may correspond to the highest local nitrogen concentration within the metal nitride layer).

Additional acts may be carried out in the method. An order of acts of the method may vary if the general concept of providing the metal nitride layer above the semiconductor substrate with a maximum concentration of a distribution of nitrogen content throughout the metal nitride layer being at the interface region. This method offers a broader process window for LTA (compared to other manufacturing methods) and produces semiconductor devices with good electrical performance.

Of course, the present disclosure is not limited to the above features and advantages. Indeed, those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other, instead emphasis being placed upon illustrating the principles of the present disclosure. Like reference numerals designate corresponding similar parts. The features of the various illustrated examples can be combined unless they exclude each other. Examples are depicted in the drawings and are detailed in the description which follows.

FIGS. 1 to 3 illustrate an exemplary embodiment of a method of producing a semiconductor device having a metal nitride layer, wherein FIG. 1 illustrates a semiconductor substrate, FIG. 2 illustrates a semiconductor substrate with a deposited metal nitride layer, and FIG. 3 illustrates the semiconductor substrate with metal nitride layer after thermal annealing.

DETAILED DESCRIPTION

Figure 1:
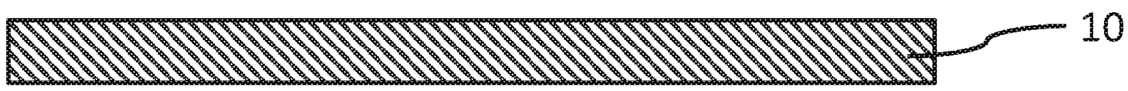

In the following detailed description, semiconductor devices with metal nitride layers as Ohmic contact layers and methods of manufacturing thereof in a simple and cost sensitive manner are described. The semiconductor substrate may comprise or consist of at least one of a semiconductor wafer or one or more epitaxial layers. The epitaxial layers may comprise epitaxial structures, which, for instance, be provided within or on a surface region of the epitaxial layers or the wafer. For example, the substrate may comprise only epitaxial layers and may be devoid of a wafer. For example, a wafer that has been used for epitaxial growth might have been removed in previous process acts. In another example, a wafer may at least partly be present in the substrate, for example at the backside of the semiconductor substrate, while one or more epitaxial layers are provided thereon at the front side of the semiconductor substrate. Then, the semiconductor substrate which shall be provided with contacts can be the wafer at the backside thereof. For example, the semiconductor devices can be manufactured from semiconductor substrates, such as Si, silicon carbide (SiC), gallium nitride (GaN) or other III/V or II/VI semiconductor substrates, which are to be provided with metal contacts at the backside of the substrate. Even though this specification mostly refers to semiconductor devices and methods for contacting the backside semiconductor surface with metal nitride layers, techniques of the specification can be used for providing front side and/or backside contacts in, for example power metal-oxide-semiconductor field effect transistors (MOSFETs), SiC based diodes, or junction-gate field effect transistors (J-FETs). The terms "front side" and "backside" (also called "rear side") are used with reference to the orientation in the examples shown in the drawing section. Because components of embodiments can be positioned in several different orientations, the directional terminology is used for purposes of illustration only and shall in no way considered to be limiting.

The metal nitride layers are provided as Ohmic contact layers above the semiconductor substrates. In this specification, the term "above" does mean that a layer is applied on the surface of a substrate or via one or more other structures or layers. Thereby the layer may be directly on the substrate or may extend directly onto another layer or elements, or intervening layers or elements may also be present. In contrast, when a layer or an element is referred to as being "directly on" or extending "directly onto" another layer or element, there are no intervening layers or elements present.

The metal nitride layers are described herein as layers, but they can be applied above the semiconductor substrate, for example directly on the surface of the semiconductor substrate, as a continuous layer or can be arranged as a patterned layer. Patterned layer means in this context that the metal nitride layer is forming at least one interface region with the semiconductor substrate, i. e. in this at least one interface region, the metal nitride layer is in direct contact with the semiconductor substrate surface. Accordingly, the patterned metal nitride layer may form two or more interface regions in a patterned manner, that means having a specific form or being applied in a specific distance, thus forming a pattern of metal contacts on for example the backside of a semiconductor substrate.

As described above, the metal nitride layer is applied such that it provides Ohmic contacts between the surface of the semiconductor substrate and the metal nitride layer (and/or provides Ohmic contacts between the surface of the semiconductor substrate and applied further metal stacks above the metal nitride layer), thereby providing semiconductor devices having reliable contacts in a simple and cost sensitive manner. Moreover, the metal nitride layer is suitable to reduce the contact resistance to a value of at least equivalent or less than those obtained with nickel silicide layers.

One of the reasons which may be responsible for this rather low contact resistance of the metal nitride layer may be the specific nitrogen content distribution in the metal nitride layer obtained by the hereinafter described manufacturing methods. It has been found that the distribution of nitrogen content throughout the metal nitride layer shows a maximum concentration at the at least one interface region comprising an interface between the metal nitride layer and the surface of the semiconductor substrate. The interface region may comprise a first portion of the metal nitride layer and a first portion of the semiconductor substrate. The first portion of the metal nitride layer may be in direct contact with the first portion of the semiconductor substrate at the interface. The maximum concentration may be at or close to the interface. In some embodiments, the maximum concentration is at the interface, while in other embodiments, the maximum concentration may be in a depth of one or more atomic layers (e.g., one or more atomic layers into the metal nitride layer). The maximum concentration may be at the first portion of the metal nitride layer. For example, a location of the maximum concentration may be within the first portion of the metal nitride layer. The effect appears to be reasonable due to the enrichment of nitrogen atoms and/or nitrogen molecules in the interface region (e.g., the enrichment of nitrogen atoms and/or molecules at or near the interface between the metal nitride layer and the semiconductor substrate). According to the concept as described herein, annealing of the metal nitride layer apparently causes a diffusion of nitrogen atoms within the metal nitride layer, thereby causing the enrichment in the interface region (e.g., at or nearby the interface). Usually, an injection of doping atoms into the underlying semiconductor substrate has not been observed. Thus, the reliability of the Ohmic contacts with low contact resistance in the semiconductor devices described herein may be a direct result of the thermal annealing during the metallization procedure used, instead of being an effect of nitrogen implantation within the semiconductor substrate. Hence, the effect seems to be clearly different to implantation methods commonly used for metallizations.

According to some examples, the semiconductor substrate of the semiconductor device may comprise SiC, GaN, or Si based substrates. The substrates may be silicon carbide, GaN, or Si work pieces to be processed. For example, the SiC based semiconductor substrate may be a SiC based wafer. The SiC based semiconductor substrate may, alternatively, comprise a base wafer (also called "growth substrate" or "growth wafer") onto which semiconductor layers are deposited, e. g. by using an epitaxial process. At least one epitaxial layer may adjoin a front side of the semiconductor substrate. In some examples, a metal contact layer may be provided on the SiC based semiconductor substrate. In this case, the SiC based semiconductor substrate may be a processed wafer. Exemplary processed wafers with a SiC based substrate may comprise power MOSFETs or diodes or J-FETs. Those SiC based electronic components, usually have a n-doped SiC substrate layer at the backside of the semiconductor substrate to be contacted with a metal contact layer. At the front side of the semiconductor substrate, a p-doped semiconductor layer at the interface between the semiconductor substrate and the metal contact layer may be required for a reliable Ohmic contact. While emphasis is placed on manufacturing methods for Ohmic contacts at power MOSFETs or diode component parts, the embodiments and examples described herein are not intended to be limited to these specific electronic components. Instead, the methods can be used for manufacturing Ohmic contacts of any other electronic components based on a SiC, GaN, or Si-based substrate, for example epitaxial layers comprised by the SiC, GaN, or Si substrate. Moreover, the term "substrate" may include processed wafers comprising several epitaxial layers in which the growth substrate has been at least partially removed before the backside contact may be generated. In addition, the interface between the semiconductor substrate front and/or backside and the metal layer may be doped with other dopants. For example, n-doped layers at the front side or p-doped layers at the backside may also be selected depending on the electronic device produced. For each doping type "n" or "p", different doping concentrations can be used. Generally, these concentrations are identified as n− or p+, for example. In this specification, any doping type indicated herein may have the same or different absolute concentration than the same type in another embodiment or example.

The semiconductor substrate and, if applicable, the epitaxial layers for these electronic devices usually are monocrystalline. Exemplary embodiments of monocrystalline semiconductor materials are mostly based on 4H-SiC or 6H-SiC substrates. Thus, as described above, the substrate may comprise device structures within the substrate. In some examples, before the contacts are provided by depositing metal nitride (and/or depositing further metal layer stacks in addition to the metal nitride, for example), further device structures may be produced within the base substrate. In addition, thickness reducing acts of the semiconductor substrate, if needed, may be applied before the manufacturing of the contacts.

In some examples, the substrate may be a grinded wafer or a substrate with a specifically adjusted roughness of its surface, as substrates with different roughness originating from grinding processes of the substrate surface may improve the measured contact resistance values. A higher surface roughness which may be generated by grinding or thinning the substrate, may lead to more defects present at the SiC surface. The higher number of defects caused by a higher roughness may then be responsible for the lower contact resistance values in the obtained Ohmic contacts at the interface between the SiC substrate and the metal nitride layer. In some examples, the higher number of defects can also lead to a higher number of docking stations for nitrogen on the SiC surface. The nitrogen may originate from the metal nitride film. This ultimately may decrease the resistance of ohmic contact to SiC.

The higher number of defects, i. e. the higher surface roughness, may also be used to lower the LTA energy which is required for the formation of a good Ohmic contact at the interface between the SiC substrate and the metal layer. Thus, a higher roughness may facilitate to lower the LTA energy required to form a good Ohmic contact in the subsequent annealing process. Therefore, a larger process window for the LTA process in the production can be offered with the adjustment of the roughness of the substrate surface.

According to some examples, the semiconductor device may be based on a metal nitride layer comprising a metal component of one or more main group metals or transition metals. Exemplary main group metal nitrides may be selected from Si or Al nitrides. Suitable transition metal nitrides for the contact layers are based on any transition metal forming stable nitrides and having ceramic properties. Exemplary transition metals may be selected from the group consisting of Ni (nickel), Ti (titanium), V (vanadium), Zr (zirconium), Nb (niobium), Mo (molybdenum), Hf (hafnium), Ta (tantalum), and W (tungsten). In some examples, Ti, Si, Al, W, Ta, and Mo are used as metal components for depositing a metal nitride layer above the semiconductor substrate. Mixed metal nitrides are suitable as well as nitrides with various stoichiometric contents of metal and nitrogen. In exemplary embodiments, the metal nitride layer comprises $Si_3N_4$ or $Al_3N_4$. Titanium nitride (TiN) or titanium tungsten nitride (TiWN) are specific examples having Ron values and Body diode performance with minor dependency to the LTA energy during laser thermal annealing. They can be used to carry out the above-described enrichment of nitrogen atoms within the interface region of the semiconductor substrate and the metal nitride layer, thus forming a maximum concentration of nitrogen content at the interface region (e.g., the maximum concentration of nitrogen content may be at or close to the interface in the interface region). Thereby a large process window for LTA is possible if, for example, TiN or TiWN is used as metal nitride for the Ohmic contacts in the semiconductor devices with metal nitride contact layer. The contact resistance measured using transmission line method (TLM) reveals that the contact resistance with TiN layer is around 14 to 15 $mOhm*mm^2$ ($milliOhms \times millimeters^2$), which is lower than NiSi based values (e.g., current NiSi based values) in some semiconductor devices (which may be around 30 $mOhm*mm^2$).

According to some other embodiments of the semiconductor device, the metal nitride layer may be selected from other metal nitrides or dielectrics. Therefore, they may comprise dielectrics such as $Si_3N_4$ or $Al_3N_4$.

Some examples of the semiconductor devices have a metal nitride layer wherein the at least one interface region with enriched nitrogen content comprises the interface between the metal nitride layer and the surface of the substrate. The interface region may extend into the metal nitride layer not more than about 20 nanometers (nm), such as not more than about 15 nm, such as not more than about 10 nm, for instance, in a range from about 5 nm to about 15 nm.

According to at least some embodiments, the content of excessive nitrogen in the TiN lattice within the metal nitride layer at the location of the maximum concentration of nitrogen content is higher than (e.g., at least 10 times higher than, and/or at least 100 times higher than) the content of excessive nitrogen which can be achieved by using another implantation method. Excessive nitrogen is that content of nitrogen which is diffused into the location of the maximum by the annealing processes described herein. If the nitrogen content in the TiN layer is 50%, the nitrogen content at the location of the maximum concentration of nitrogen content may be increased by 1% or more. In some examples, the total content of nitrogen within the metal nitride layer at a region having the maximum concentration of nitrogen content may be about 51 atomic-% or higher when measured with transmission electron microscopy energy-dispersive X-ray (TEM-EDX) (e.g., elemental mapping) enrichment but can be higher in other embodiments. In other words, when using the methods described herein, the content of excessive nitrogen may, for example, be enriched by the factor of at least 10, sometimes 100 or more, compared to other implantation methods. Thus, the semiconductor devices as described herein have an improved contact resistance due to the high content of electron carriers at or near the interface.

According to at least some examples, the semiconductor device may have at least one interface region (comprising the first portion of the metal nitride layer and the first portion of the semiconductor substrate, for example) which is in contact with an additional doping region formed in the semiconductor substrate. Thus, the above-described novel concept of metal nitride Ohmic contact layers with low contact resistance can be combined with dopant implantation. For example, on the wafer backside, that means, the backside of the substrate, the deposition of scattering oxide or a resist for implantation generally is not easily possible due to glass carrier processes. Therefore, the metal layer may be deposited first on the wafer and through this metal layer, the implantation will be performed. This facilitates the processing of the wafer which will be described later in greater detail with regard to the manufacturing processes. The dopants, e. g. nitrogen, implanted into the semiconductor substrate, e. g. SiC substrate, can be activated at the same time as the nitrogen content in the metal nitride layer is enriched at or close to the interface by using a thermal anneal, e. g. laser thermal anneal. Thus, the high nitrogen content within the metal nitride layer at or close to the interface together with the nitrogen or dopant atoms in the semiconductor substrate are then responsible for improving, that means further reducing the Ohmic contact value by high doping at or close to the interface (e.g., high doping at the at least one interface region). Thus, further improved Ohmic contacts with low resistance values can be achieved if an additional implantation region within the semiconductor substrate is provided. Moreover, the additional implants may improve the stability in processing. Depending on the dopants, various properties can be achieved. Those implants may be provided at or close to the interface between the metal nitride layer and the substrate. Suitable implantation depths (also known as ion range peak) in the semiconductor substrate are about 50 nm or less, such as in a range from about 5 nm to about 50 nm, such as in a range from about 5 nm to about 30 nm, for instance about 5 nm. In some embodiments, the implantation can also extend into the metal nitride layer for some extent, for example about 10 nm within the metal nitride layer. Preferably, the ion range peak is close to (e.g., within a threshold distance of) the interface between the metal nitride layer and the semiconductor substrate and the location of the ion range peak can suitably be adjusted by the implantation energy used, for example. The implantation energy may be among others dependent on the thickness of the metal layer.

Exemplary embodiments of the semiconductor devices may further comprise additional metallization structures above the metal nitride layer. These additional metallization structures may be composed of the same or different metal components as the metals deposited in the metal nitride layer. Generally, one or more additional layers may be used to improve the contacts or provide better soldering properties to the metal contacts.

In some examples, the metal nitride layer and the additional metallization structures may be used to provide a backside metallization of the semiconductor device. The obtained metal contacts have lower contact resistance values and show good electrical performance compared to other metal contacts.

The herein described semiconductor devices can be obtained by novel approaches for the formation of Ohmic contacts on the wafer backside by using a non-critical material approach. According to an embodiment, the method for producing a semiconductor device comprises providing a semiconductor substrate, depositing a metal nitride layer above the semiconductor substrate, and performing thermal annealing of at least the metal nitride layer. The thermal annealing may be performed such that nitrogen atoms and/or nitrogen molecules from the metal nitride layer are enriched in the at least one interface region. The at least one interface region may comprise a first portion of the semiconductor substrate, a first portion of the metal nitride layer, and/or an interface between the first portion of the semiconductor substrate and the first portion of the metal nitride layer (e.g., the first portion of the semiconductor substrate and the first portion of the metal nitride layer may be in direct contact at the interface). The enrichment of the nitrogen in the at least one interface region may result in: (i) a concentration of nitrogen content at the first portion of the metal nitride layer being higher than a concentration of nitrogen content at a second portion, of the metal nitride layer, outside the interface region, (ii) the concentration of nitrogen content at the first portion of the metal nitride layer being higher than concentrations of nitrogen content throughout all portions, of the metal nitride layer, outside the interface region, and/or (iii) a distribution of nitrogen content throughout the metal nitride layer having a maximum concentration at the first portion of the metal nitride layer. During the thermal annealing, at least some nitrogen from the metal nitride layer may be driven to the interface (e.g., into the at least one interface region) and may be activated (e.g., the at least some nitrogen may be driven to the interface and activated at the same time). This may be due to bonding of nitrogen to dangling bonds or damaged locations of SiC.

In some examples, the thermal annealing is performed by an LTA process. However, it can also be used a thermal annealing or annealing thermally by light absorbing layer and laser anneal, for example.

In some embodiments, the thermal annealing can be performed under a reactive atmosphere, such as $NH_3$ or forming gas ($N_2$ mixed with $H_2$, e. g. about 5% $H_2$ admixture) atmosphere, or a pure nitrogen atmosphere. The reactive atmosphere using nitrogen components facilitates to improve the enrichment of nitrogen near the interface. Other reactive nitrogen-based compounds may be used as well.

As described above, the metal nitride layer obtained by thermal annealing may provide Ohmic contacts between the surface of the semiconductor substrate and the metal nitride layer (and/or provides Ohmic contacts between the surface of the surface of the semiconductor substrate and applied further metal stacks above the metal nitride layer), thereby providing semiconductor devices having reliable contacts in a simple and cost sensitive manner. Moreover, the metal nitride layer thus obtained is suitable to reduce the contact resistance to a value equal or less than those obtained with nickel silicide layers.

The nitrogen content (e.g., specifically adjusted nitrogen content) in the metal nitride layer having a maximum concentration at the at least one interface region (e.g., the maximum concentration may be at or close to the interface between the metal nitride layer and the surface of the semiconductor substrate) seems to (and/or may) be responsible for the good contact resistances measured in the semiconductor devices manufactured according to the methods described herein. In some examples, the maximum concentration is at the interface, while in other embodiments, the maximum concentration may be in a depth of one or more atomic layers (e.g., one or more atomic layers into the metal nitride layer). The maximum concentration may be at the first portion of the metal nitride layer. For example, a location of the maximum concentration may be within the first portion of the metal nitride layer. The effect appears to be reasonable due to the enrichment of nitrogen atoms and/or nitrogen molecules in the interface region (e.g., the enrichment of nitrogen atoms and/or molecules at or near the interface between the metal nitride layer and the semiconductor substrate). According to the concept as described herein, the thermal annealing of the metal nitride causes a diffusion of nitrogen atoms within the metal nitride layer, thereby causing the enrichment in the interface region (e.g., at the interface). As explained above, due to bonding of nitrogen to dangling bonds or damaged locations of SiC, an improvement of electric performance by lowering the electric resistivity can be achieved.

In some examples, the method comprises treating the surface of the semiconductor substrate with a grinding process and/or a thinning process, which may be performed before depositing the metal nitride layer. Thereby, the roughness of the semiconductor substrate may be adjusted by the grinding process and/or the thinning process. Thus, more defects may be present at the surface of the semiconductor substrate surface and, thus, at the interface between the semiconductor substrate and the metal nitride layer, which may facilitate the formation of a good Ohmic contact. With higher roughness, for example, the LTA energy may be lowered when generating the good Ohmic contact in the annealing act. Hence, the process may offer a large process window for the LTA in the production of the semiconductor devices with good Ohmic contact.

Exemplified thermal annealing processes comprise laser thermal annealing (LTA) with suitable energy densities dependent of the metal nitride systems prepared. The Ron and Body diode performance advantageously has minor dependency on the LTA energy densities used. Moreover, the good Ron values exhibit very large process windows for LTA if TiN is used as Ohmic contact in the above-described methods. Other annealing methods than LTA can be used. Examples are annealing thermally by light absorbing layer and laser anneal.

A reason for the good electric performance of the Ohmic contacts with metal nitride layers above the semiconductor substrate may be due to less impact of bi-products which usually are generated during thermal annealing process of silicide reactions. In silicide reactions usually carbon clusters or grains within the metal layer or at the interface of SiC/metal or silicon oxide particles are generated or NiSi bumps and other phenomena reducing the reliability are observed. In some examples, the methods as described herein do not show similar effects and, thus, are able to produce reliable Ohmic contacts using a wide process window during the LTA processing. The adjustment of the surface roughness may further be used to specifically adjust the contact resistance and/or the LTA energy to be used during annealing processing. Hence, the obtained semiconductor devices with metal nitride Ohmic contacts generally are provided with mechanical stable backside metallizations showing less delamination events and less cracks even at high temperature applications. Thus, they can be produced with high yields and good reliability. At the same time the produced Ohmic contacts show good electrical performance.

In some examples, the thermal annealing comprises the heating of the metal nitride layer and the surface regions of the semiconductor substrate at the at least one interface region. During the thermal annealing, the nitrogen concentration at or close to the interface to the semiconductor substrate increases up to a local maximum concentration within the metal nitride layer, also called herein “maximum”, even though higher nitrogen contents in the metal nitride layer may be possible. At the same time, dopants in the n-doped semiconductor substrate may be activated during the laser thermal anneal, thereby increasing the dopant concentration near the interface to the metal nitride contact layer. At the same time amorphous or non-crystalline regions may be annealed. Recrystallization processes improve the electrical performance of the metallization produced in these methods.

In some examples of the methods, the thermal annealing is performed such that the at least one interface region with enriched nitrogen content extends into the metal nitride layer not more than about 20 nm, such as not more than about 15 nm, for instance less than about 10 nm. It is advantageous that the maximum of the nitrogen content is at or close to the interface to the semiconductor substrate to increase the electrical performance.

In some embodiments of the method, it may be preferred to additionally provide a doped region within the semiconductor substrate at or close to the interface to the metal nitride layer provided there above. Therefore, some examples comprise an implantation act for implanting dopants through the metal nitride layer into the surface regions of the semiconductor substrate. For example, after thinning a wafer as the semiconductor substrate to a desired thickness by grinding or any other abrasive or non-abrasive method, a metal nitride layer can be deposited above the wafer and dopants, such as nitrogen or phosphor, may be implanted to increase the dopant concentration in the semiconductor substrate. During the thermal annealing, for example by using a LTA, the metal nitride layer forms a good Ohmic contact by enrichment of nitrogen content near the interface and, at the same time, the dopants within the semiconductor substrate surface or close to the interface will be activated, thereby increasing the dopant concentration and electric performance at the interface of the semiconductor substrate and the metal nitride contact layer. Exemplified depths of the implanted dopants are in a range from about 5 nm to about 50 nm relative to the metal substrate interface (e.g., the interface between the metal nitride layer and the semiconductor substrate).

In further embodiments, the method comprise depositing additional metallization structures above the metal nitride layer in order to finalize metal contact of semiconductor devices. Suitable additional metallization structures are described with regard to the semiconductor device. Accordingly, semiconductor devices with good electrical performance can be obtained.

Figure 2:
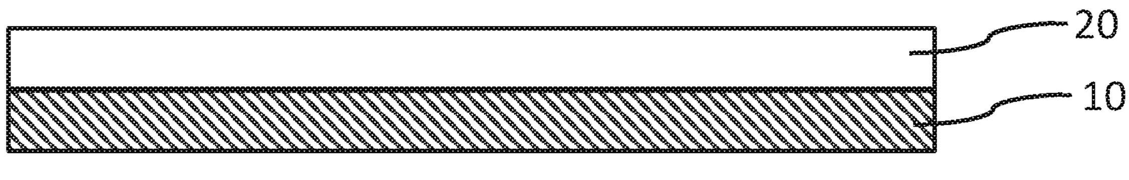
Figure 3:
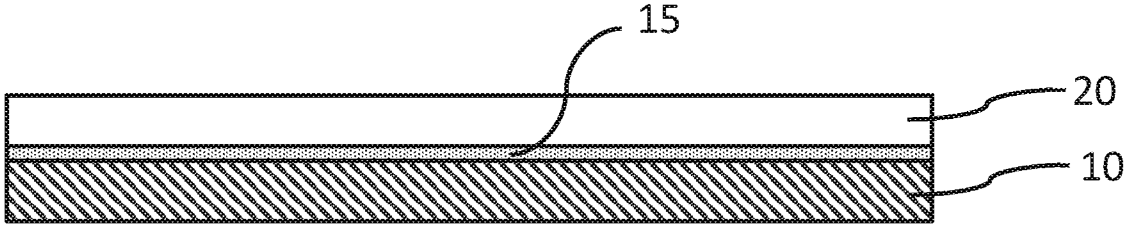
Figure 4:
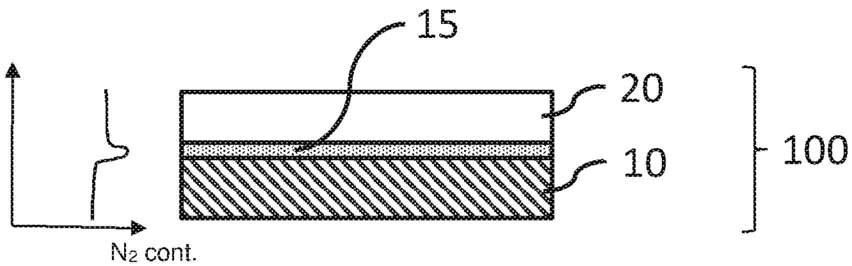
FIG. 4 illustrates an exemplary embodiment of a semiconductor device with a metal nitride layer and an exemplary profile of Na content after thermal annealing.

The above-described embodiments will be further described by referring to the drawings which show different acts of a method of producing a semiconductor device in FIGS. 1 to 3 as well as an exemplary semiconductor device manufactured therewith in FIG. 4.

Referring now to FIG. 1 a semiconductor substrate 10 such as a silicon carbide substrate is shown. Even though this example is described with regard to SiC substrate, any other suitable substrate may be used as well. The silicon carbide substrate 10 in this example is a 4H-SiC n-type doped silicon carbide substrate which may have been provided with epitaxial layers or structures at the front side thereof, which are not shown in the figures.

In this example, referring now to FIG. 2, the back side of the SiC substrate 10 is treated by chemical vapor deposition of metal nitride layer 20 (e. g. TiN layer deposition) above the SiC substrate surface. Other deposition methods such as plasma vapor deposition (PVD) or atomic layer deposition (ALD) may be used as well. At least in some parts of the semiconductor surface, the metal nitride layer 20 has direct contact with the semiconductor substrate surface.

After the deposition of the metal nitride layer 20 above the SiC substrate 10, the stack of layer 10 and 20 is treated by thermal annealing, in this example by laser thermal annealing of at least the metal nitride layer 20 and surface portions of the SiC substrate 10.

After the thermal annealing, for example by laser thermal annealing, the good Ohmic contact performance obtained in the semiconductor device may be caused by changing the local electric structure of the interface region 15, especially in the metal nitride layer as shown in FIG. 3. In an example, the interface region 15 comprises (i) a first portion of the metal nitride layer 20, wherein the first portion of the metal nitride layer 20 is proximal the SiC substrate 10, (ii) a first portion of the SiC substrate 10, wherein the first portion of the SiC substrate 10 is proximal the metal nitride layer 20, and/or (iii) an interface between the metal nitride layer 20 and the SiC substrate 10. It has been observed by transmission electron microscopy (TEM) micrographs and energy-dispersive X-ray (EDX) mapping of thermally annealed structures that the distribution of nitrogen content throughout the metal nitride layer shows a higher concentration of nitrogen content at the interface region 15 (e.g., at or near the interface between the metal nitride layer 20 and the SiC substrate 10) than in a second portion, of the metal nitride layer 20, outside the interface region 15. The second portion of the metal nitride layer 20 may correspond to a portion, of the metal nitride layer 20, above the interface region 15. Hence, the thermal annealing may cause an injection or enrichment of nitrogen atoms from the metal nitride layer 20 into regions at and/or near the interface of the metal nitride layer 20 and the SiC substrate 10. Some of the metal nitride material in the metal nitride layer 20 may be decomposed and rearrangements within the metal nitride lattice may take place. The defects of the SiC surfaces may be favorable locations where N from TiN can be bonded during thermal annealing. This may be described as a quasi-epitaxial growth of metal nitride at the SiC at the interface of these two layers. The nitrogen atoms included in the metal nitride layer favorably may bond to defects of the SiC surfaces during thermal annealing. This increases the local doping of SiC.

Moreover, some of the nitrogen atoms generated by the decomposition reactions diffuse towards the SiC substrate surface such that the nitrogen content close to the interface region 15 is enriched. Nitrogen clusters or nitrogen intercalations into the metal nitride lattice on an atomic level may take place in the interface region 15. The nitrogen atoms enriched in this interface region may function similar as doping atoms in the metal nitride layer. Other parts of the metal nitride layer have, due to the out-diffusion, less contents of nitrogen or higher metal concentrations than in the interface region 15.

In some examples, a content of nitrogen in the interface region 15 obtained by this method may be higher than (e.g., at least 10 times higher than, and/or at least 100 times higher than) nitrogen contents obtained by other implantation methods. Furthermore, the examples showed that the nitrogen injection into SiC substrate layer 10 was less or could not be observed at all. In addition, contrary to other thermal annealing processes of metal material layers deposited above SiC substrates, no metal silicide formation was observed in the experiments conducted. At least no measurable content of metal silicide has been measured in the examples of the metal nitride contacts obtained with the herein described method. Moreover, the occurrence of carbon clusters such as after silicide formation in silicide processes has not been observed, at least in some embodiments. Maybe such clusters, if generated at all, were not detectable due to the low overall carbon content in the metal nitride layer. In case of TiN layers, silicides or carbides of titanium are likely to be generated in case some silicon or carbon from SiC will be decomposed during thermal annealing.

Accordingly, the method as described in FIGS. 1 to 3 is suitable for manufacturing semiconductor devices with reliable Ohmic contacts in a simple and cost sensitive manner. At the same time, the method is suitable for removing or preventing the formation of biproducts like formation of carbon clusters or graphitic layers in metallization layers for contacting SiC substrates or any other semiconductor substrate.

Referring now to FIG. 4, an exemplary embodiment of a semiconductor device with a metal nitride layer as obtainable by the method described in the FIGS. 1 to 3 is shown. The semiconductor substrate comprises a SiC substrate 10, a metal nitride (e.g., TiN) layer 20 and interface region 15 where the SiC substrate 10 and the metal nitride layer 20 are in contact with each other. At the left side of the cross section through this semiconductor device 100, a concentration of $N_2$ content is shown. From this qualitative diagram, it can be gathered that the maximum concentration of $N_2$ content is within the interface region 15, while the nitrogen content is low (e.g., relatively low) in the semiconductor substrate 10 and the metal nitride layer 20. The diagram is merely a qualitative description of the concentration of nitrogen atoms within the cross section of a semiconductor device 100 obtainable by one of the herein described methods. In case of additional nitrogen implantations, further maxima or higher concentrations may be possible also in the semiconductor substrate, for example. Hence, this graph shall explain the definition of maximum instead of limit this feature to this specific example as shown herein.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise. Although specific embodiments have been illustrated and described herein, it will be appreciated by those of ordinary skill in the art that a variety of alternate and/or equivalent implementations may be substituted for the specific embodiments and examples shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device, comprising:
- a semiconductor substrate; and
- a metal nitride layer above the semiconductor substrate, wherein:
  - an interface region of the semiconductor device comprises:
    - a first portion of the semiconductor substrate;
    - a first portion of the metal nitride layer; and
    - an interface between the first portion of the semiconductor substrate and the first portion of the metal nitride layer, wherein a surface of the semiconductor substrate at the interface comprises a roughened surface having defects configured to bond with nitrogen originating from the metal nitride layer;
  - the interface region extends into the metal nitride layer not more than 20 nanometers (nm); and
  - a concentration of nitrogen content at the first portion of the metal nitride layer is higher than a concentration of nitrogen content at a second portion, of the metal nitride layer, outside the interface region.

2. The semiconductor device according to claim 1, wherein the semiconductor substrate comprises at least one of silicon carbide (SiC), gallium nitride (GaN), or Si (silicon).

3. The semiconductor device according to claim 1, wherein the metal nitride layer comprises at least one of Ti (titanium), Si (silicon), Al (aluminum), W (tungsten), Ta (tantalum), or Mo (molybdenum).

4. The semiconductor device according to claim 1, wherein the metal nitride layer comprises at least one of $Si_3N_4$ or $Al_3N_4$.

5. The semiconductor device according to claim 1, wherein the interface region extends into the metal nitride layer not more than 15 nm.

6. The semiconductor device according to claim 1, wherein the interface region is in contact with a doping region formed in the semiconductor substrate.

7. The semiconductor device according to claim 1, comprising metallization structures above the metal nitride layer.

8. The semiconductor device according to claim 7, wherein the metal nitride layer and the metallization structures provide a backside metallization of the semiconductor device.

9. A semiconductor device, comprising:
- a semiconductor substrate; and
- a metal nitride layer above the semiconductor substrate, wherein:
  - an interface region of the semiconductor device comprises:
    - a first portion of the semiconductor substrate;
    - a first portion of the metal nitride layer; and
    - an interface between the first portion of the semiconductor substrate and the first portion of the metal nitride layer, wherein a surface of the semiconductor substrate at the interface comprises a roughened surface having defects configured to bond with nitrogen originating from the metal nitride layer;
  - the interface region extends into the metal nitride layer not more than 20 nanometers (nm); and a distribution of nitrogen content throughout the metal nitride layer has a maximum concentration at the first portion of the metal nitride layer.

10. The semiconductor device according to claim 9, wherein the semiconductor substrate comprises at least one of silicon carbide (SiC), gallium nitride (GaN), or Si (silicon).

11. The semiconductor device according to claim 9, wherein the metal nitride layer comprises at least one of Ti (titanium), Si (silicon), Al (aluminum), W (tungsten), Ta (tantalum), or Mo (molybdenum).

* * * * *